United States Patent
Prakash et al.

(10) Patent No.: US 11,545,226 B1
(45) Date of Patent: Jan. 3, 2023

(54) SYSTEMS AND METHODS FOR COMPENSATING FOR ERASE SPEED VARIATIONS DUE TO SEMI-CIRCLE SGD

(71) Applicant: SanDisk Technologies LLC, Addison, TX (US)

(72) Inventors: Abhijith Prakash, Milpitas, CA (US); Xiang Yang, Santa Clara, CA (US)

(73) Assignee: SanDisk Technologies LLC, Addison, TX (US)

(*) Notice: Subject to any disclaimer, the term of this patent is extended or adjusted under 35 U.S.C. 154(b) by 14 days.

(21) Appl. No.: 17/355,684

(22) Filed: Jun. 23, 2021

(51) Int. Cl.
G11C 16/26 (2006.01)
G11C 16/34 (2006.01)
G11C 16/14 (2006.01)
G11C 16/10 (2006.01)

(52) U.S. Cl.
CPC ........ *G11C 16/3459* (2013.01); *G11C 16/102* (2013.01); *G11C 16/14* (2013.01); *G11C 16/26* (2013.01); *G11C 16/3404* (2013.01); *G11C 16/3445* (2013.01)

(58) Field of Classification Search
CPC ... G11C 16/3459; G11C 16/102; G11C 16/14; G11C 16/26; G11C 16/3404; G11C 16/3445
See application file for complete search history.

(56) References Cited

U.S. PATENT DOCUMENTS

2019/0378583 A1* 12/2019 Lien ............... G11C 16/0483

* cited by examiner

*Primary Examiner* — Xiaochun L Chen
(74) *Attorney, Agent, or Firm* — Dickinson Wright PLLC; Steven C. Hurles

(57) ABSTRACT

Non-volatile memory systems are disclosed. The memory systems include rows of memory holes FC-SGD and SC-SGD, the latter of which may be created by a SHE cutting operation. The SC-SGD include erase speeds slower than those of FC-SGD. In order to overcome the erase speed disparities, SC-SGD are programmed to a higher Vt as compared to FC-SGD. By programming SC-SGD to a higher Vt, the erase speed increases and matches the erase speed of FC-SGD. Further, different SC-SGDs are cut to different amounts, creating different erase speeds among SC-SGD. SC-SGDs with a greater degree/amount of cut have slower erase speeds as compared to SC-SGDs with a lesser degree/amount of cut. However, verify levels among SC-SGDs can differ to produce SC-SGDs with Vt's such that their erase speeds match with each other as well as with FC-SGD.

20 Claims, 15 Drawing Sheets

SYSTEMS AND METHODS FOR COMPENSATING FOR ERASE SPEED VARIATIONS DUE TO SEMI-CIRCLE SGD

TECHNICAL FIELD

This application is directed to utilizing memory holes in which the edges are cut/altered, thus defining semi-circle memory holes. In particular, this application is directed to programming both full circle (i.e., uncut/unaltered) memory holes and semi-circle memory holes using different threshold voltages. These different threshold voltages allow the full circle and semi-circle memory holes to achieve similar erase speeds.

BACKGROUND

Semi-circle drain side select gate ("SC-SGD") memory technology offers several advantages, including reduced die size. In order to produce SC-SGD, etching technology is used to cut memory holes, thus giving them their semi-circular shape, and separating a block or row into several strings. Depending upon the process used to form the SC-SGD, certain inefficiencies can occur. For example, if the memory holes are improperly cut, they can be rendered useless, i.e., unable for use during erase operations. Additionally, dummy holes are often found in memory devices that provide a non-function buffer between two regions of a row.

SC-SGD are formed alongside full circle drain side select gate ("FC-SGD"), and accordingly, a block can include both FC-SGD and SC-SGD. However, the respective erase speeds of FC-SGD and SC-SGD are different. For example, the FC-SGD erase speed is faster than the SC-SGD erase speed. In situations when the SC-SGD erase speed is too slow, the SC-SGD memory technology cannot be implemented. In this regard, even when SC-SGD memory holes are functional (i.e., able to store some user data), other issues, such as relative erase speed, remain a problem.

SUMMARY

An aspect of the present disclosure is related to a method for programming a memory device. The method includes programming one or more select gates of a first row of memory holes to a first threshold voltage. The one or more select gates of the first row of memory holes defines define full circle drain side select gate (FC-SGD). The method continues with causing, based on the first threshold voltage, the one or more select gates of the first row of memory holes to include a first erase speed. The method continues with programming one or more select gates of a second row of memory holes to a second threshold voltage different from the first threshold voltage. The one or more select gates of the second row of memory holes defines semi-circle drain side select gate (SC-SGD). The method continues with causing, based on the second threshold voltage, the one or more select gates of the second row of memory holes to include a second erase speed that is at least within a threshold erase speed of the first erase speed.

In an embodiment, the second erase speed matches the first erase speed.

In an embodiment, the method continues with programming the one or more select gates of the first row of memory holes includes applying a first programming voltage. The method continues with programming the one or more select gates of the second row of memory holes includes applying a second programming voltage that is greater than the first programming voltage.

In an embodiment, prior to programming the one or more select gates of the first row and the one or more select gates of the second row, the method continues with determining whether the one or more select gates of the second row of memory holes defines the SC-SGD. The method continues with programming the one or more select gates of the second row of memory holes based upon a predetermined verify level.

In an embodiment, prior to programming the one or more select gates of the first row of memory holes and the one or more select gates of the second row memory holes, the method continues with providing an erase pulse to one or more select gates of the first row of memory holes and the one or more select gates of the second row of memory holes. The method continues with determining, based on the erase pulse, a first erase speed of the one or more select gates of the first row of memory holes and a second erase speed of the one or more select gates of the second row of memory holes.

In an embodiment, when the first erase speed is faster than the second erase speed, the method continues with setting the second threshold voltage higher than the first threshold voltage.

In an embodiment, the one or more select gates of the first row of memory holes are located in a first row of a memory block of the memory device, and the one or more select gates of the second row of memory holes are located in a second row of the memory block.

According to another aspect of the disclosure, a memory system includes a memory device. The memory system includes a controller operatively coupled to the memory device. The controller is configured to program one or more select gates of a first row of memory holes to a first threshold voltage. The one or more select gates of the first row of memory holes defines define full circle drain side select gate (FC-SGD). The controller is further configured to cause, based on the first threshold voltage, the one or more select gates of the first row of memory holes to include a first erase speed. The controller is further configured to program one or more select gates of a second row of memory holes to a second threshold voltage different from the first threshold voltage. The one or more select gates of the second row of memory holes defines semi-circle drain side select gate (SC-SGD). The controller is further configured to cause, based on the second threshold voltage, the one or more select gates of the second row of memory holes to include a second erase speed that is at least within a threshold erase speed of the first erase speed.

In an embodiment, the second erase speed matches the first erase speed.

In an embodiment, the controller is further configured to program the one or more select gates of the first row of memory holes includes applying a first programming voltage. The controller is further configured to program the one or more select gates of the second row of memory holes includes applying a second programming voltage that is greater than the first programming voltage.

In an embodiment, prior to programming the one or more select gates of the first row and the one or more select gates of the second row, the controller is further configured to determine whether the one or more select gates of the second row of memory holes defines the SC-SGD. The controller is further configured to program the one or more select gates of the second row of memory holes based upon a predetermined verify level.

In an embodiment, prior to programming the one or more select gates of the first row of memory holes and the one or more select gates of the second row memory holes, the controller is further configured to provide an erase pulse to one or more select gates of the first row of memory holes and the one or more select gates of the second row of memory holes. The controller is further configured to determine, based on the erase pulse, a first erase speed of the one or more select gates of the first row of memory holes and a second erase speed of the one or more select gates of the second row of memory holes.

In an embodiment, when the first erase speed is faster than the second erase speed, controller is further configured to set the second threshold voltage higher than the first threshold voltage.

In an embodiment, the one or more select gates of the first row of memory holes are located in a first row of a memory block of the memory device, and the one or more select gates of the second row of memory holes are located in a second row of the memory block.

According to another aspect of the disclosure, a non-transitory computer readable storage medium configured to store instructions that, when executed by a processor included a controller of a memory system, cause the memory system to carry out steps to program one or more select gates of a first row of memory holes to a first threshold voltage. The one or more select gates of the first row of memory holes defines define full circle drain side select gate (FC-SGD). The instructions further cause the memory system to carry out steps to cause, based on the first threshold voltage, the one or more select gates of the first row of memory holes to include a first erase speed. The instructions further cause the memory system to carry out steps to program one or more select gates of a second row of memory holes to a second threshold voltage different from the first threshold voltage. The second row of memory holes defines semi-circle drain side select gate (SC-SGD). The instructions further cause the memory system to cause, based on the second threshold voltage, the one or more select gates of the second row of memory holes to include a second erase speed that is at least within a threshold erase speed of the first erase speed.

In an embodiment, the second erase speed matches the first erase speed.

In an embodiment, the instructions further cause the memory system to program the one or more select gates of the first row of memory holes includes applying a first programming voltage. The instructions further cause the memory system to program the one or more select gates of the second row of memory holes includes applying a second programming voltage that is greater than the first programming voltage.

In an embodiment, prior to programming the one or more select gates of the first row and the one or more select gates of the second row, the instructions further cause the memory system to determine whether the one or more select gates of the second row of memory holes defines the SC-SGD. The instructions further cause the memory system to program the one or more select gates of the second row of memory holes based upon a predetermined verify level.

In an embodiment, prior to programming the one or more select gates of the first row of memory holes and the one or more select gates of the second row memory holes, the instructions further cause the memory system to is further configured to provide an erase pulse to one or more select gates of the first row of memory holes and the one or more select gates of the second row of memory holes. The instructions further cause the memory system to determine, based on the erase pulse, a first erase speed of the one or more select gates of the first row of memory holes and a second erase speed of the one or more select gates of the second row of memory holes.

In an embodiment, the instructions further cause the memory system to, when the first erase speed is faster than the second erase speed, set the second threshold voltage higher than the first threshold voltage.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which.

DETAILED DESCRIPTION

Figure 1A:
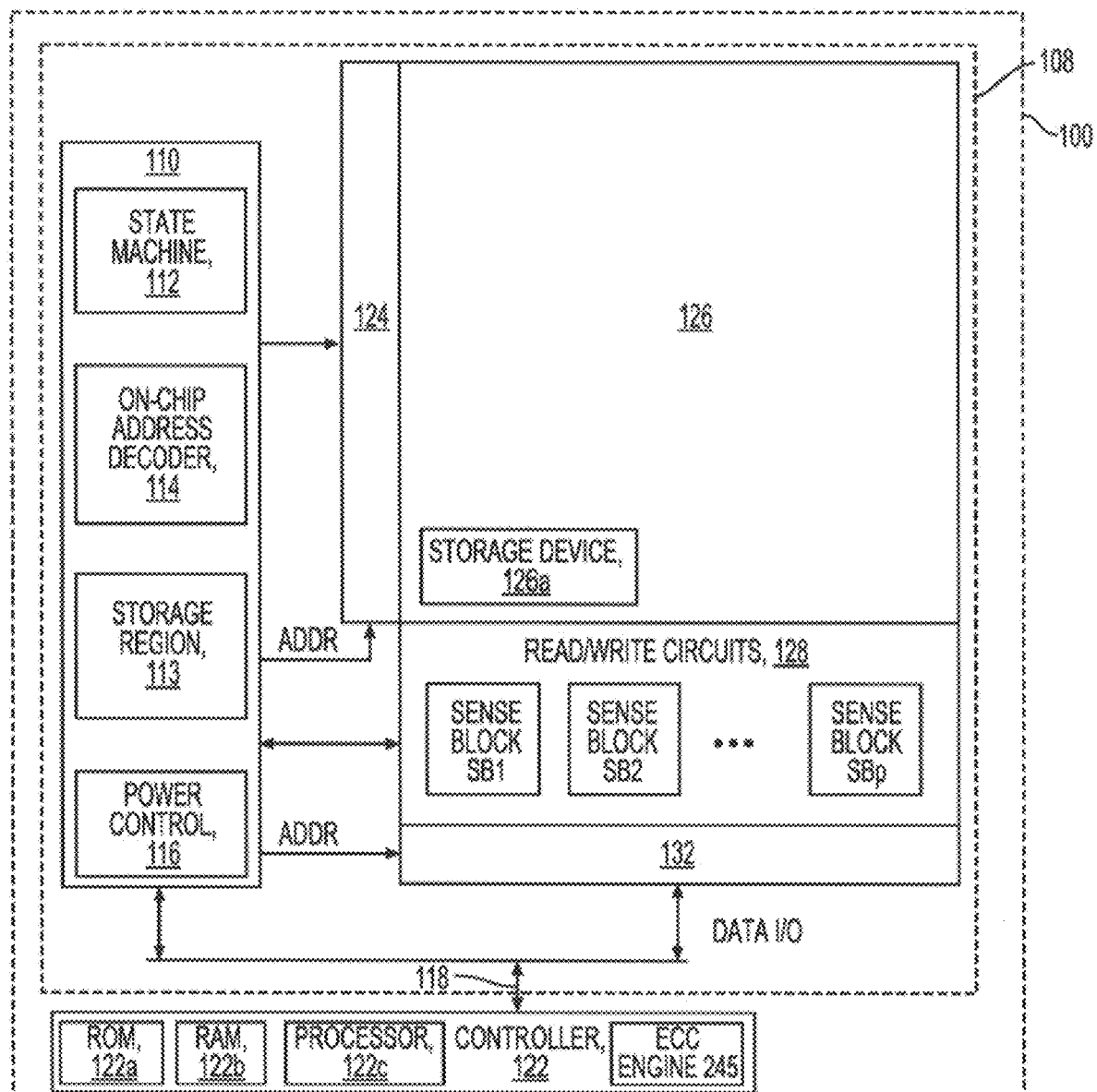
FIG. 1A is a block diagram of an example memory device.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is related to modifying semi-circle drain side select gate ("SC-SGD") memory technology to enhance performance. To form the SC-SGD, a shallow hole etch ("SHE") operation can be employed. The SHE cut can divide a block (in memory) into multiple strings within the block. While the SHE can form/define the strings, the SHE cut can further separate a string, i.e., cut the edge memory holes in a string into half (or approximately two equal halves). In this regard, both the SGD and the channel are split.

Additionally, the following disclosure is directed to utilizing SC-SGD alongside full circle drain side select gate ("FC-SGD"), the latter of which includes uncut/unaltered memory holes. When measuring erase speeds, it has been shown that FC-SGD erase speeds is faster than SC-SGD. For example, due to a reduction in the channel area under a top layer SGD, or SGDT, (used to control GIDL injection, thereby acting as a knob to control erase speed), along with SC-SGD, the gate induced drain leakage ("GIDL") injection is lower, leading to a slower GIDL erase speed. This can lead to several issues. First, the overall performance of the memory block decreases when the erase operation becomes too slow due to increased SC-SGD erase times. Additionally, even if erase speed is managed, the mismatch between FC-SGD and SC-SGD erase speeds causes different erase levels. For example, in order to pass an erase verify level, FC-SGD and SC-SGD are erased more number of times than required for FC-SGD alone, to account for slower SC-SGD erase speeds. However, this results in a deeper erase operation for FC-SGD, which can lead to reliability issues.

In this disclosure, memory holes with SC-SGD are optimized despite the split from the SHE cut. Traditional blocks of memory include dummy memory holes where channel under SGD and top layer SGD ("SGDT") undergoes SHE cut. The dummy memory holes are generally not utilized and are "sacrificial" in nature. As a result, the dummy memory holes are not utilized by the memory device to store data, and accordingly, are not programmed or read. However, the dummy holes occupy space within the block. Embodiments of the present disclosure include memory blocks in which the dummy holes are eliminated. As a result of these enhancements, a die (carrying the block) can be either be reduced in size or alternatively can maintain the same size but with more memory holes, both of which are generally desirable. Additionally, in order to overcome different erase speeds, FC-SGD and SC-SGD (including SGDT) are programmed with a different threshold voltage (Vt). For example, in some embodiments, SGDT's on SC-SGD are programmed to a higher Vt (as compared to that of FC-SGD), resulting in lower erase speeds for SGDT's. Moreover, the selected (higher) Vt is designed to cause the SGDT's on SC-SGD erase speed to match the erase speed of FC-SGD, or at least within a threshold erase speed threshold. Put another way, the selected (higher) Vt is designed to cause the SGDT's on SC-SGD erase speed to match the erase speed of FC-SGD, or at least within a threshold erase speed.

Other embodiments shown and described herein include alternative ways to match erase speeds. For example, if erase speed on SC-SGD memory holes is limited to the extent by which can be reliably reached by increasing their SGDT Vt's, the SGDT's on FC-SGD memory holes can be programmed to lower Vt's to match erase speed with SC-SGD memory holes. Further, if the SGDT Vt is fixed, making the erase speed acceptably lower, then the SGDT's on FC-SGD memory holes can be programmed to even lower Vt's to match erase speed of SC-SGD memory holes. Still further, in some embodiments, some combination of increased Vt programming for SGDT's on SC-SGD and decreased Vt programming for SGDT's on FC-SGD can be used.

Using SHE cutting operation, the degree/amount/percentage of cutting can vary. As a result, some SGDT's on SC-SGD are cut to a greater degree than others. In other words, the amount of material removed from some SC-SGD memory holes can be greater than the amount removed from others. The degree to which an SC-SGD memory hole is cut is inversely proportional to the erase speed of the SC-SGD memory hole. Accordingly, for an overshifted SC-SGD memory hole that is cut to a greater degree (i.e., relatively more material removed) than an undershifted SC-SGD memory hole (i.e., a memory hole that has relatively less material removed), the erase speed for the overshifted SC-SGD memory hole is slower than that of the undershifted SC-SGD memory hole. However, different SGDT's on SC-SGD can be programmed to different Vt's. For example, the SC-SGD memory hole that is cut to a greater degree, and hence has a slower erase speed, can be programmed to a higher Vt as compared to the SC-SGD that is less cut, resulting in the SC-SGD memory holes have the same erase speed, or at least to within a threshold erase speed of each other, and also match FC-SGD erase speed.

It should be noted that memory hole has different select gates, dummy word lines and data word lines. This detailed description describes modifications applied to SGDT's. However, in some embodiments, a memory system may not include SGDT's. In these embodiments, the SGD is used as a select gate for erase operations, and the modifications described for SGDT's can apply to SGD.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
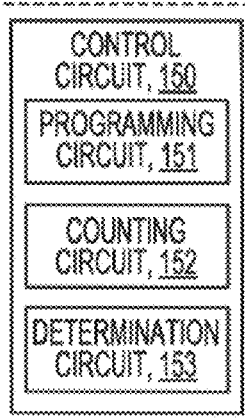
FIG. 1B is a block diagram of an example control circuit that includes a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
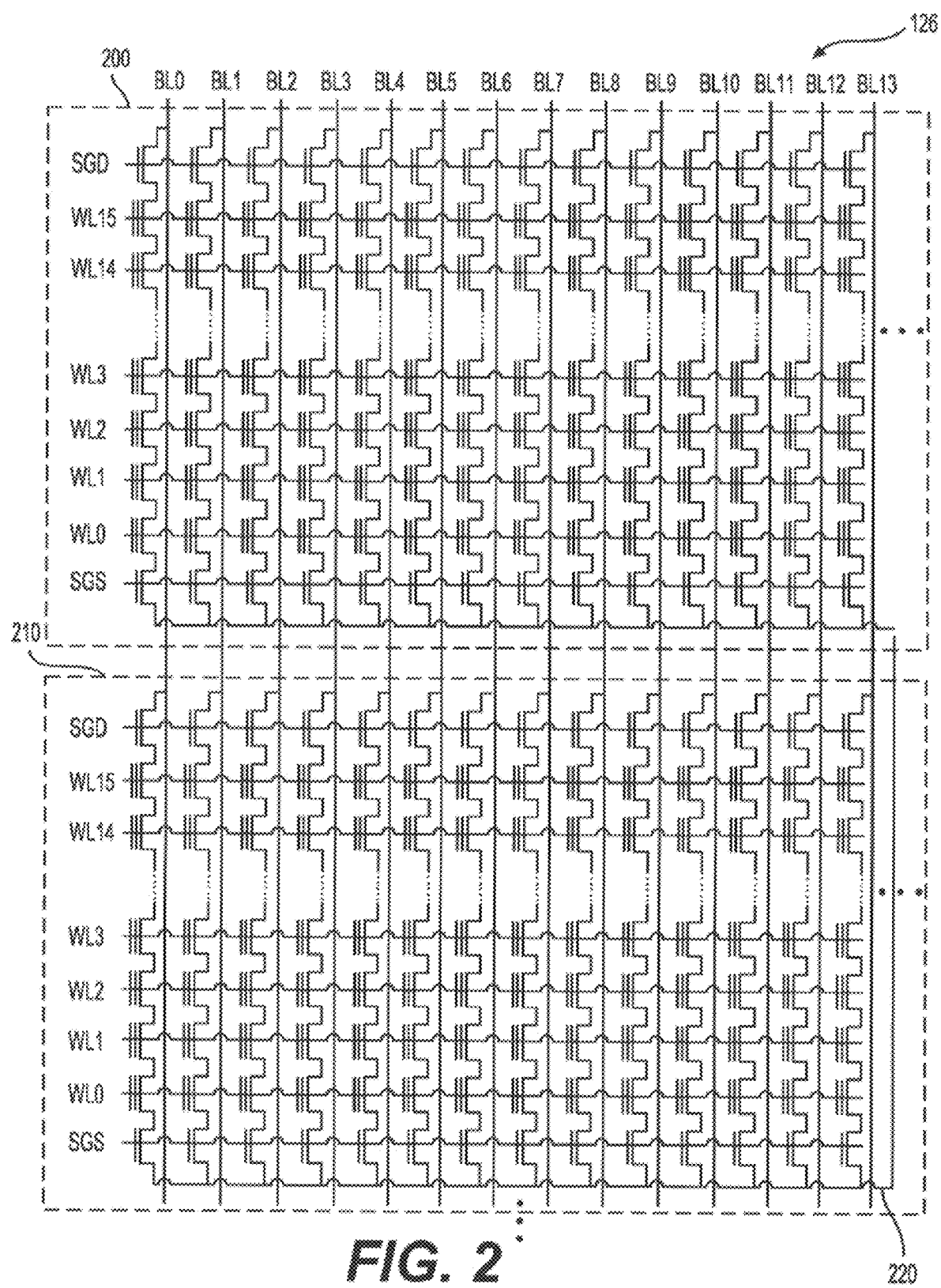
FIG. 2 illustrates schematic views of three types of memory architectures utilizing staggered memory strings.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, ... which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
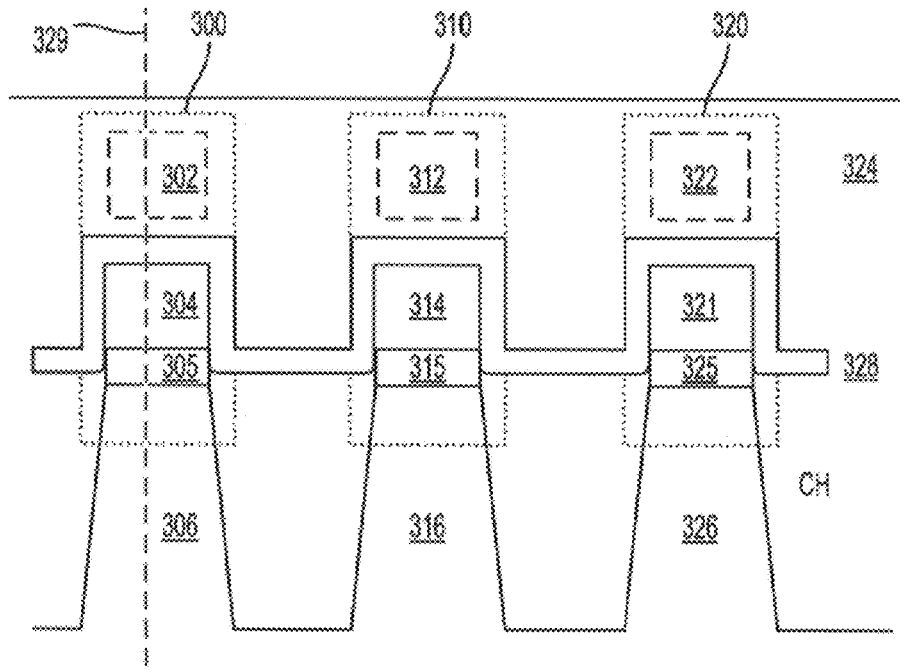
FIG. 3A illustrates a cross-sectional view of example floating gate memory cells in NAND strings.
Figure 3B:
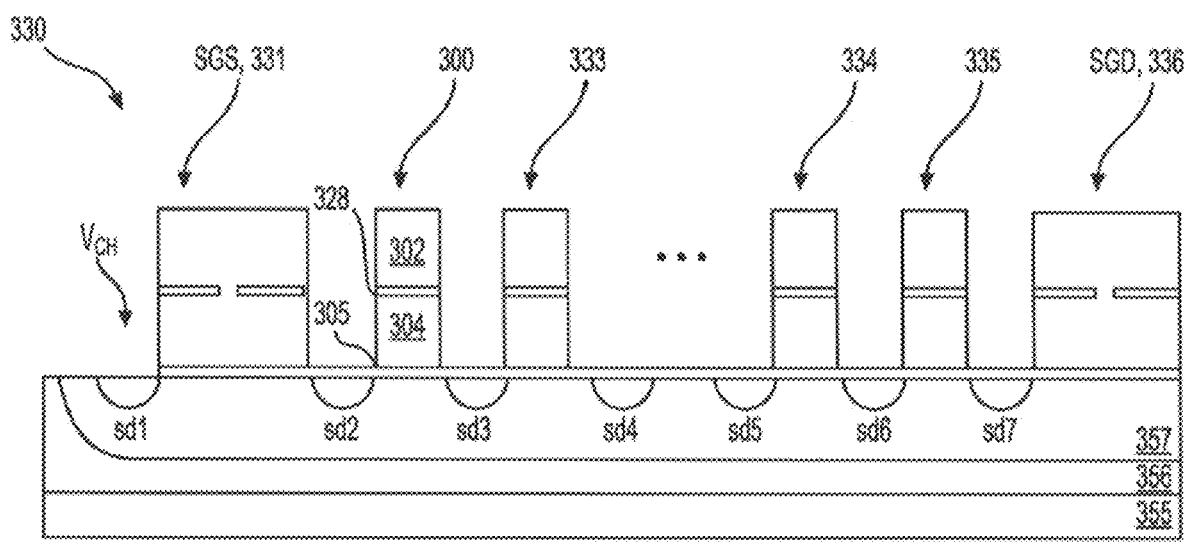
FIG. 3B illustrates a cross-sectional view along a contact line shown in FIG. 3A.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
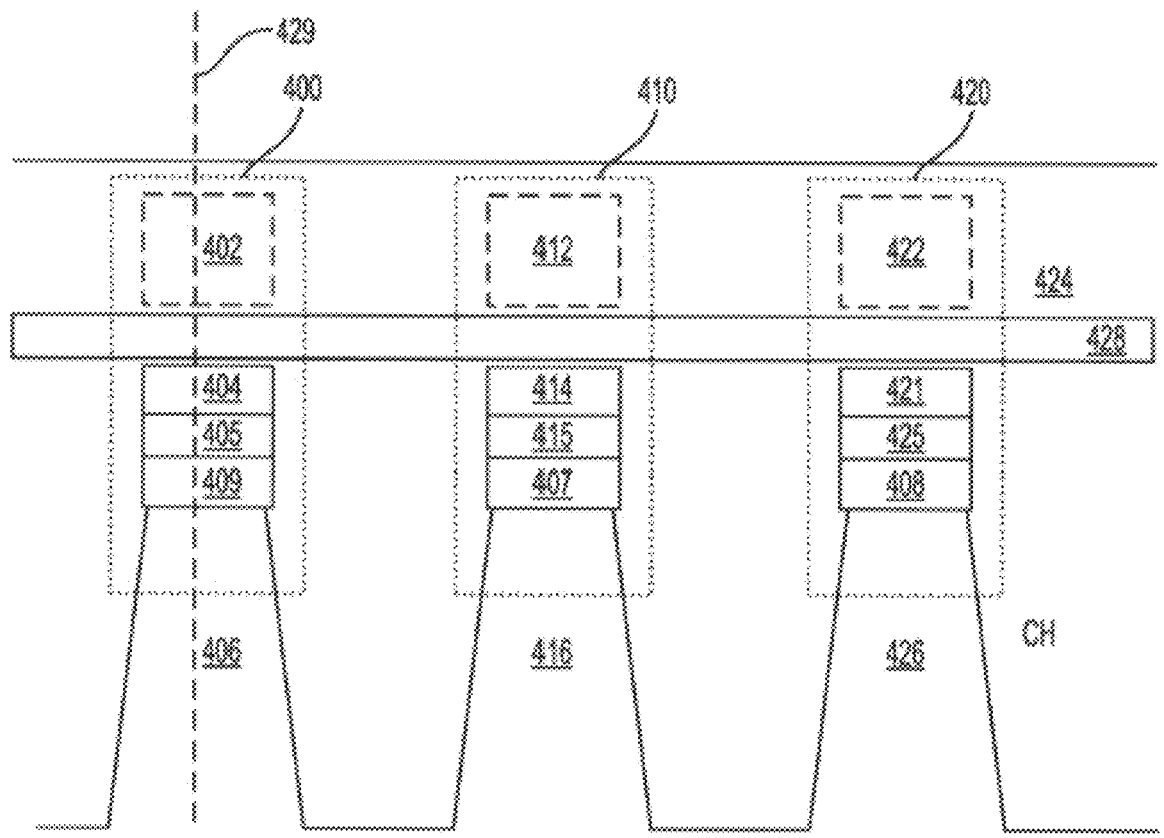
FIGS. 4A and 4B illustrate non-volatile memory in which a charge-trapping memory cell uses a non-conductive dielectric material in place of a conductive floating gate to store charge in a non-volatile manner.
Figure 4B:
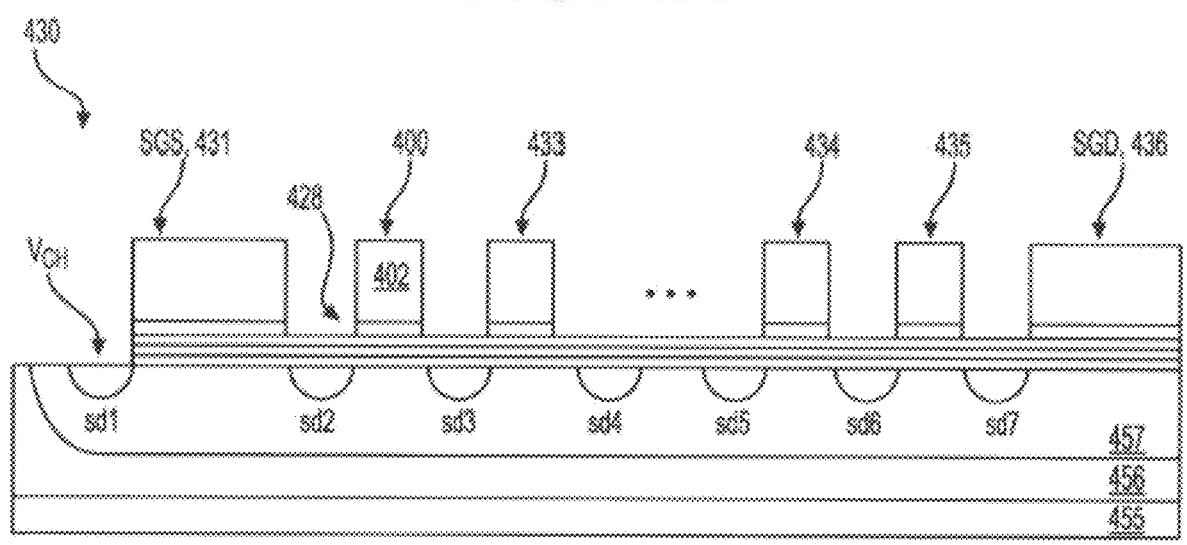

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
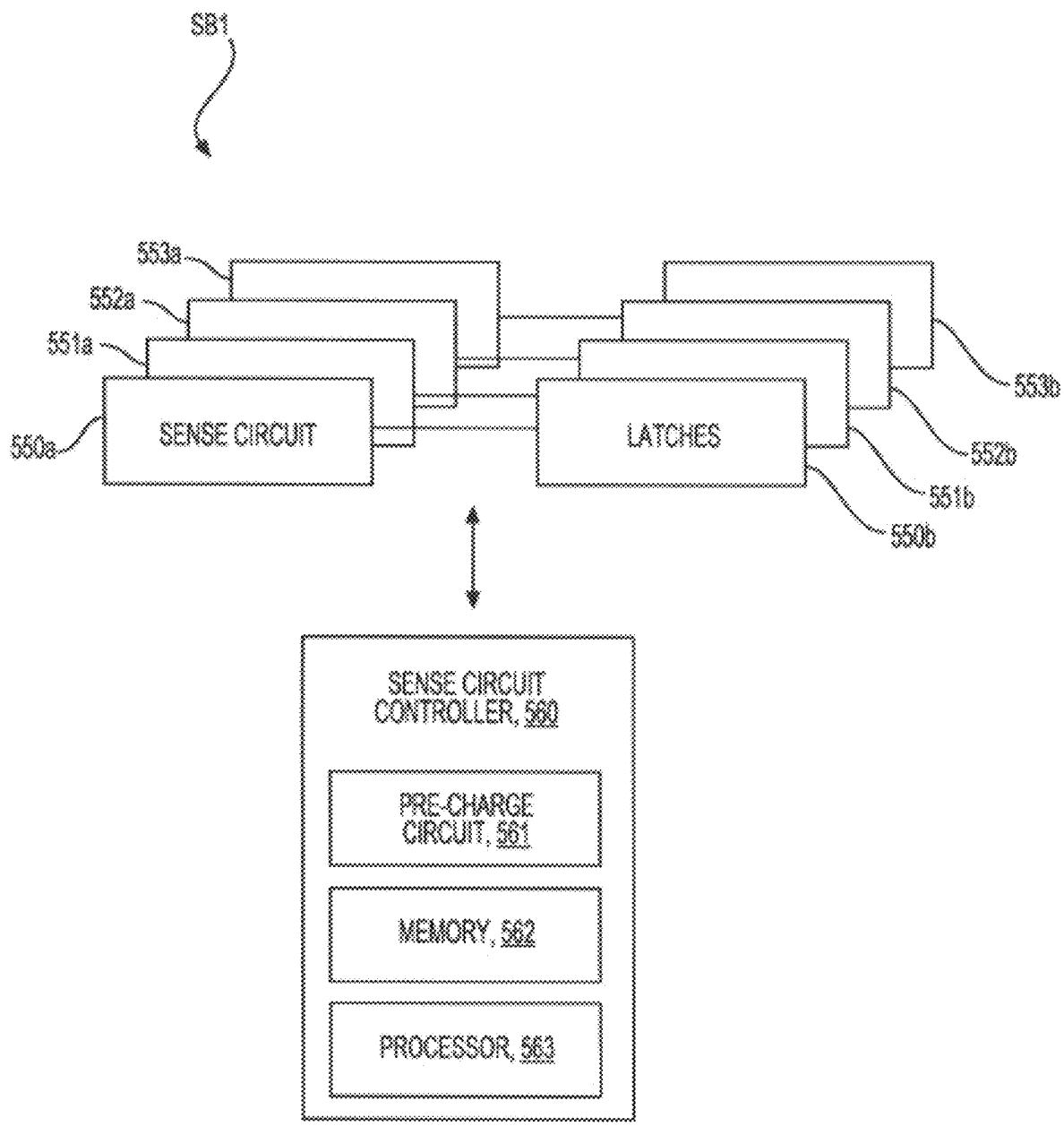
FIG. 5 illustrates an example block diagram of the sense block of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
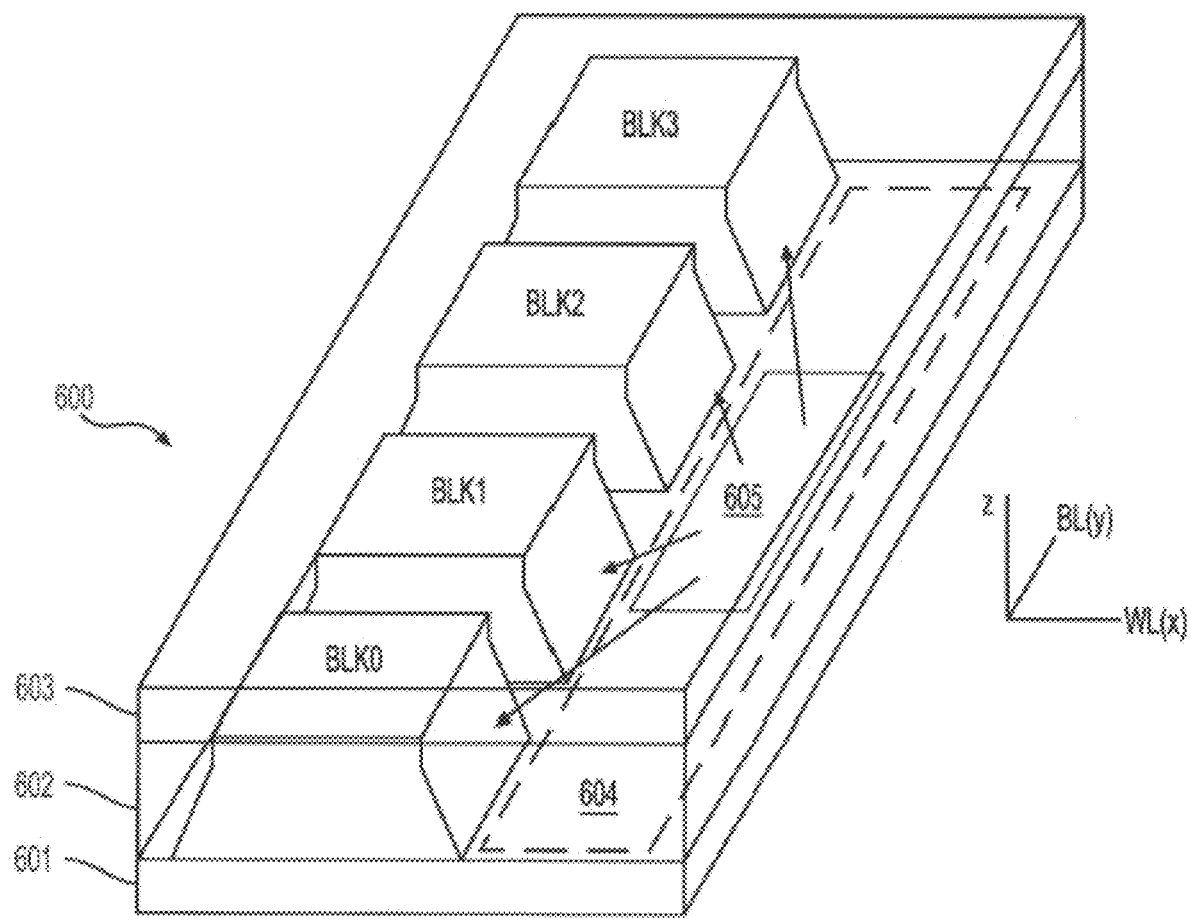
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
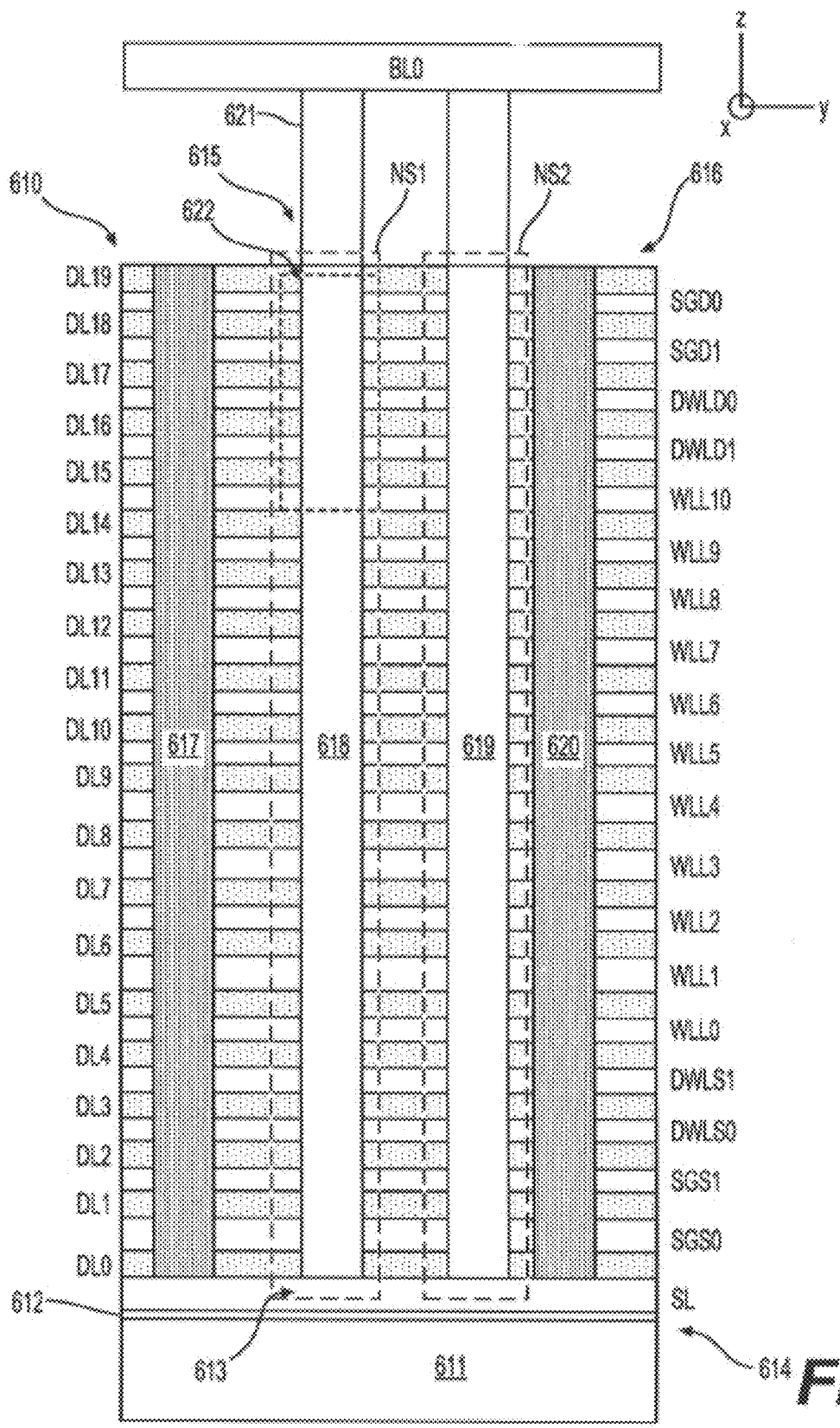
FIG. 6B illustrates an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at atop 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
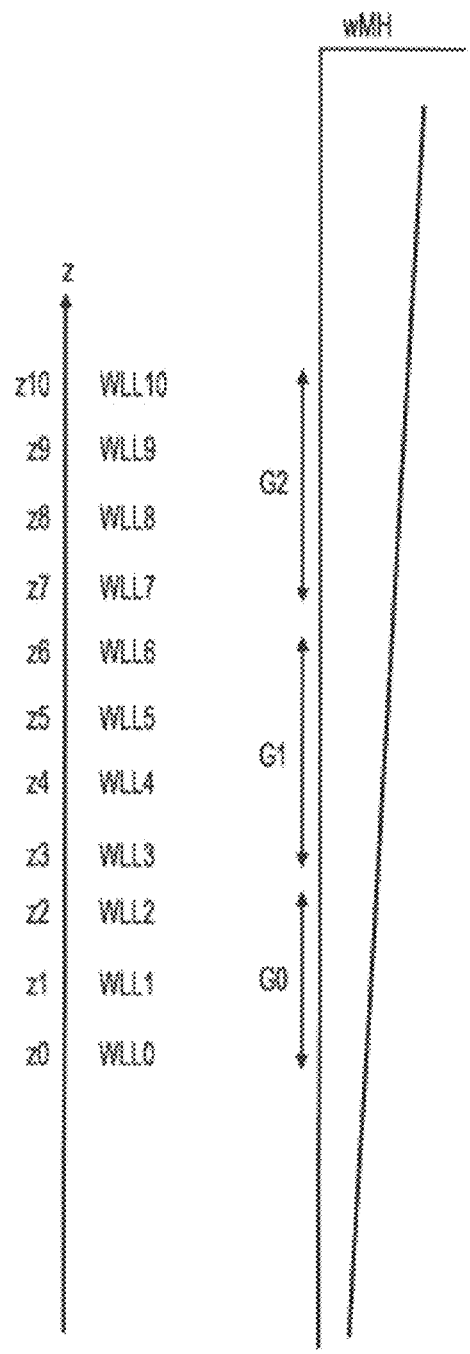
FIG. 6C illustrates a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
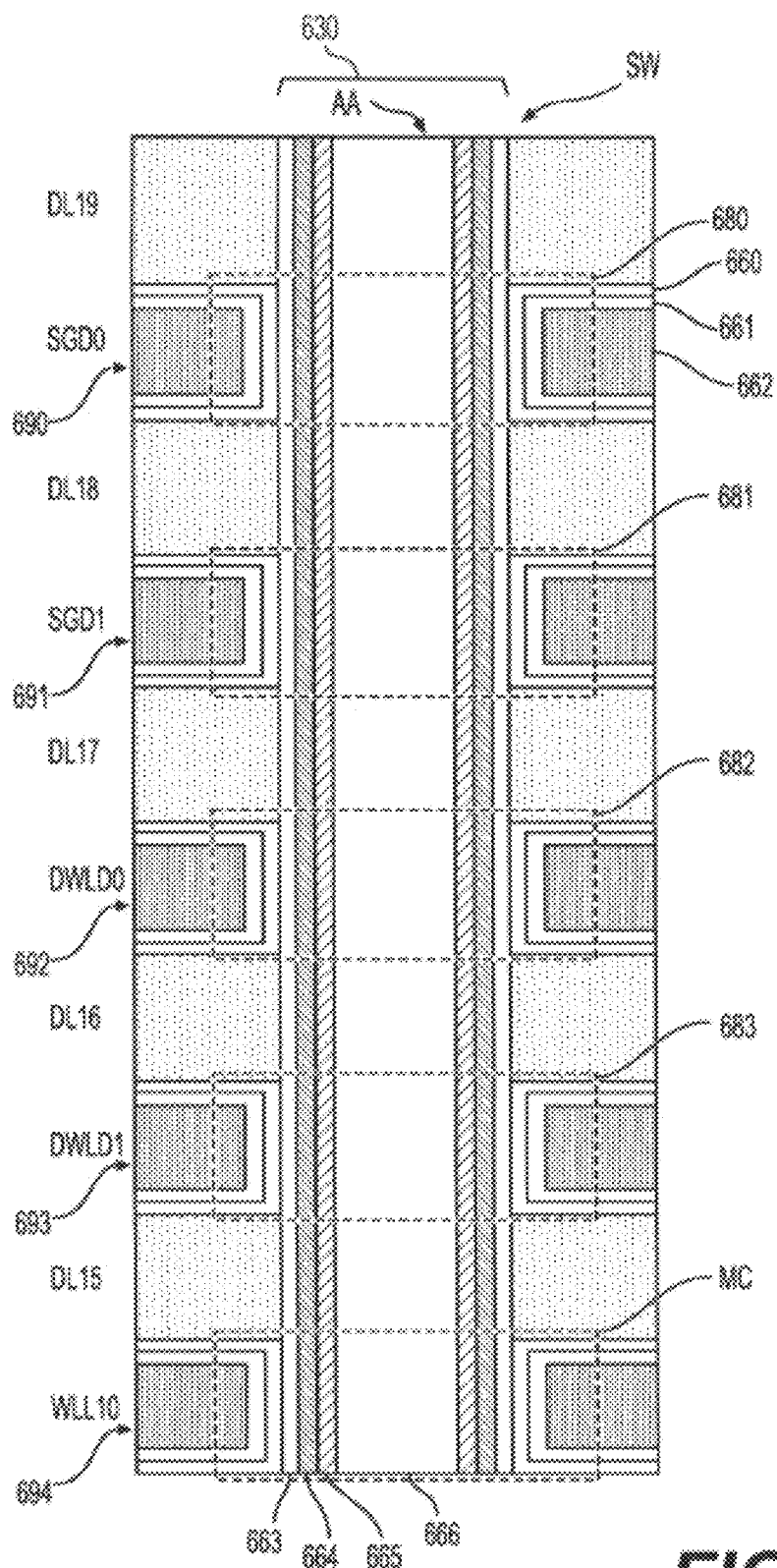
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
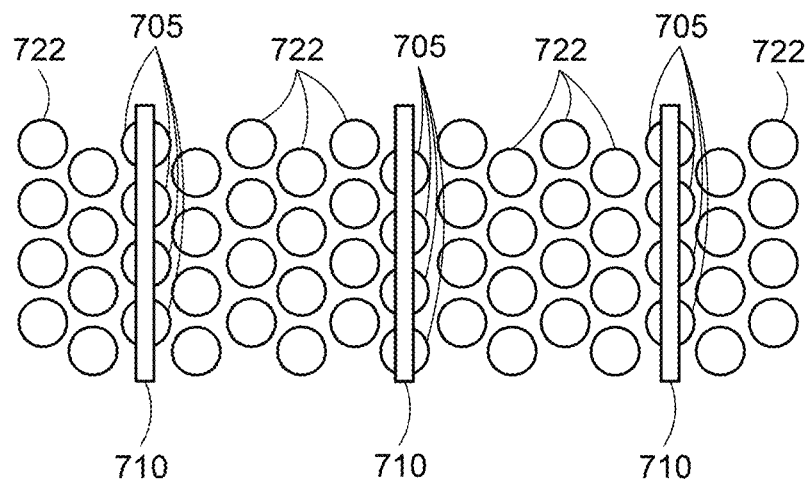
FIG. 7A illustrates a schematic plan view of a memory array with a plurality of memory holes.

FIG. 7A shows a schematic plan view of a memory array 700 with a plurality of memory holes 722, which can be vertical memory cell strands as described herein, and a plurality of dummy holes 705, which need not one complete memory structures. A shallow trench etch or shallow etching feature (SHE) 710 extends through a plurality of word lines (for example, five) but not fully through the chip to electrically isolate adjacent strings from one another. The SHE extends directly through a group of aligned dummy holes 705, thereby preventing those dummy holes 705 from storing data or otherwise being functional memory cells.

Figure 7B:
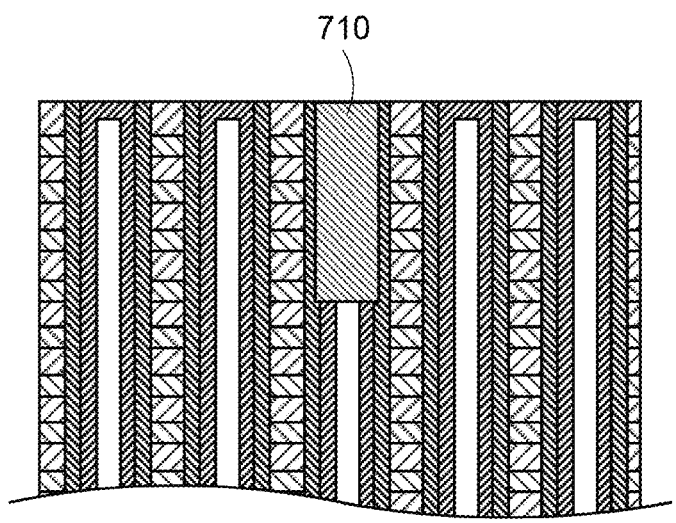
FIG. 7B illustrates a cross-sectional view of the memory array.
Figure 8A:
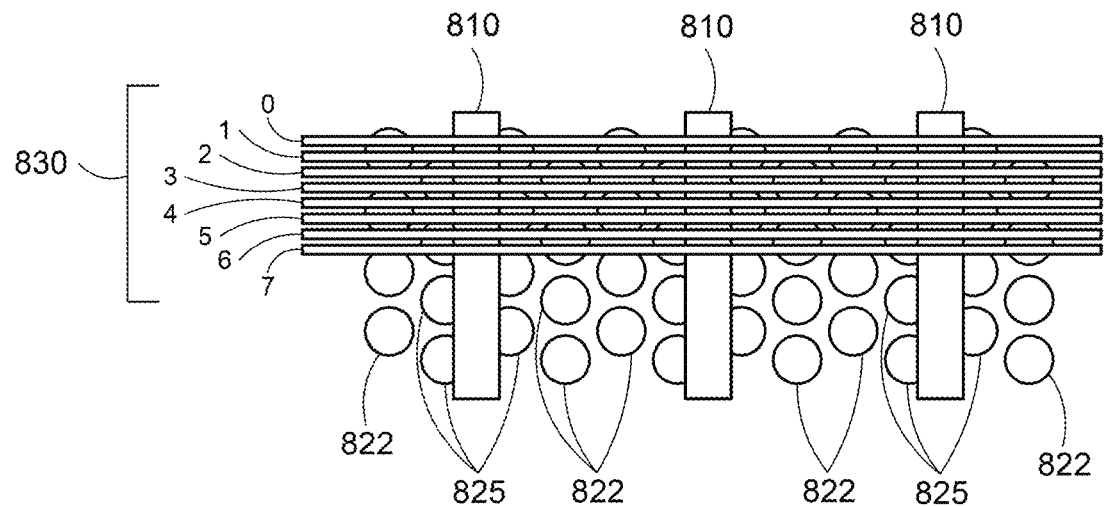
FIGS. 8A and 8B illustrate an alternate memory structure with no dummy holes.
Figure 8B:
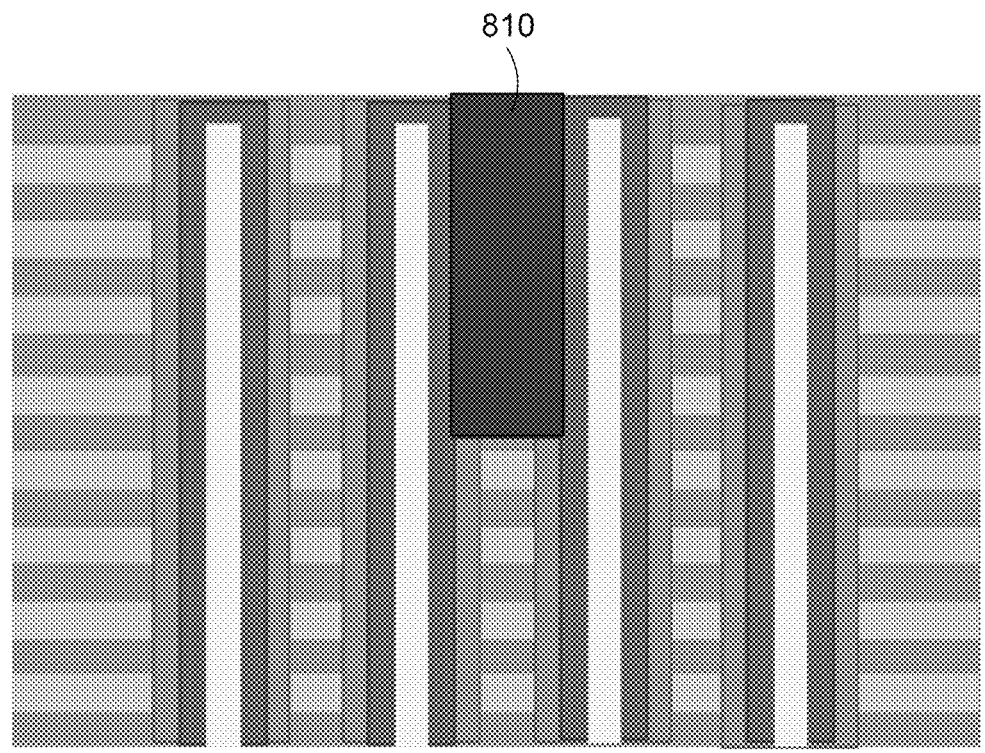

Referring now to FIGS. 8A and 8B, there are no dummy holes. Unlike the memory structure 700 of FIGS. 7A and 7B, the SHE 810 is located in a gap between two adjacent rows of memory cells 825 and overlaps with memory holes 825, thereby creating a working strand that has a trench etched down into a side of at least the SGD switch at the top of the working memory strand, here shown as memory holes 825. This configuration substantially improves yield and memory density as all of the memory holes 822, 825 are functional, i.e., fewer memory holes are wasted.

Unlike the fully circular memory holes 822, the memory holes 825 and the SGD switches that are partially cut by the SHE 810 have a semi-circular shape, which can either be a half circle or can be more or less than a half-circle. In some cases, the memory holes 825 and SGD switches can be less than half circles on one side of the SHE 810 and more than half circles on the other side of the SHE 810.

The memory holes 822, 825 are connected with a plurality of bit lines 830 (labeled as bit lines 0-7 in FIG. 8A). For ease of illustration, only eight bit lines 830 have been shown. The bit lines 830 extend over above the memory holes and are connected to select memory holes via connection points. The memory holes in each string area also connected at one end to an SGD switch and at the other end to an SGS switch. The SHE trench 810 may be etched into a portion of the SGD switch.

Figure 9:
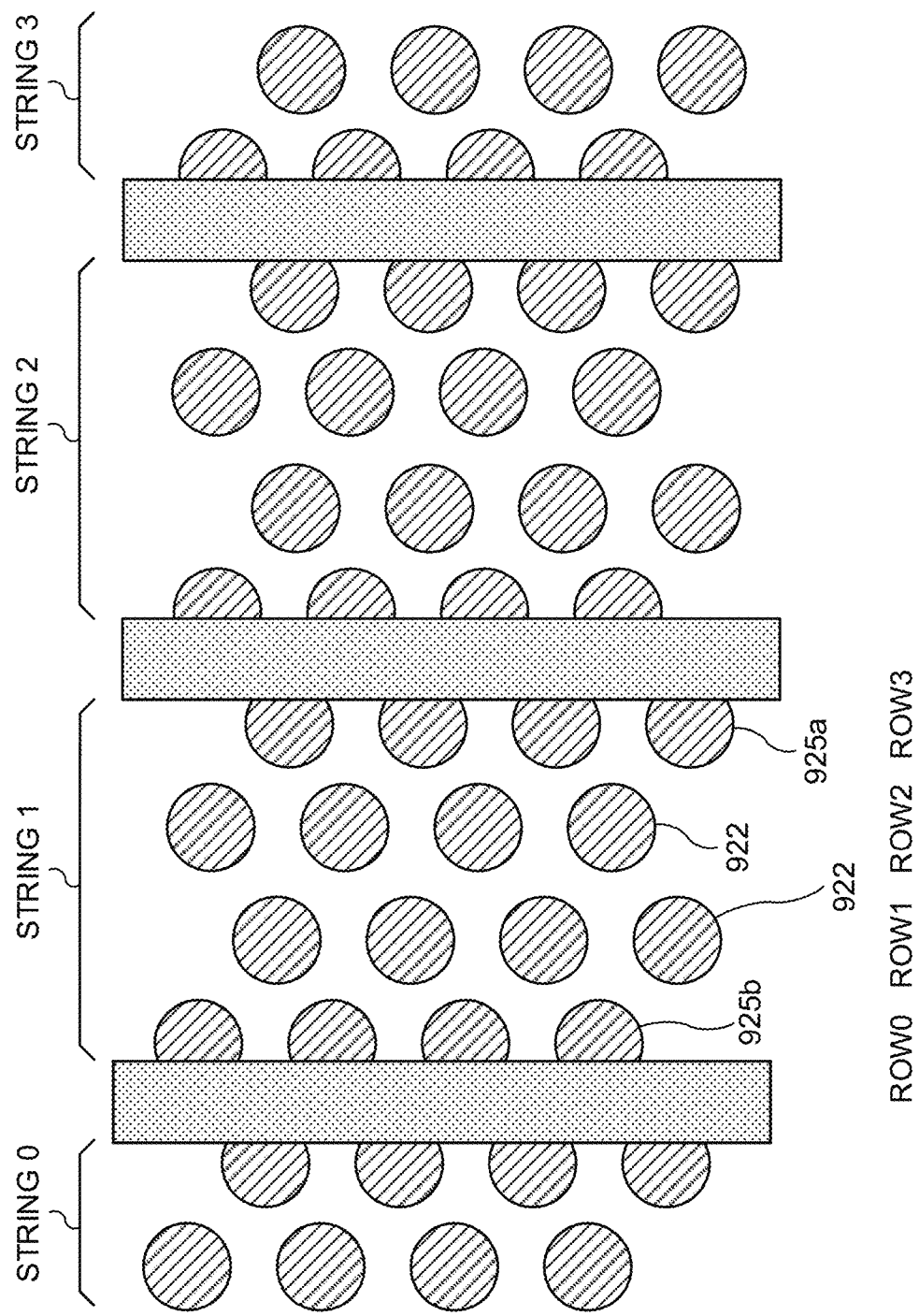
FIG. 9 illustrates an embodiment of a memory array with memory holes cut to different sizes based upon the SHE cutting operation.

Referring now to FIG. 9, due to variations and imperfections in a manufacturing operation, the SHE may be non-centrally located between adjacent rows of memory holes. When this occurs, the semi-circular SGDs on one side of the SHE trench may be dimensionally larger than the semi-circular SGDs on the other side of the SHE trench. The memory holes including the dimensionally larger SGDs are hereinafter called "undershifted SGDs," and the memory holes including the dimensionally smaller SGDs are hereinafter referred to as "overshifted memory holes." As illustrated, each string has one row of undershifted semi-circular SGDs, two rows of full-circle SGDs, and one row of overshifted semi-circular SGDs. With reference to String 1, Row 0 includes overshifted semi-circle SGDs 925*b*; Rows 1 and 2 include full-circle SGDs 922; and Row 3 includes undershifted semi-circle SGDs 925*a*.

Figure 10:
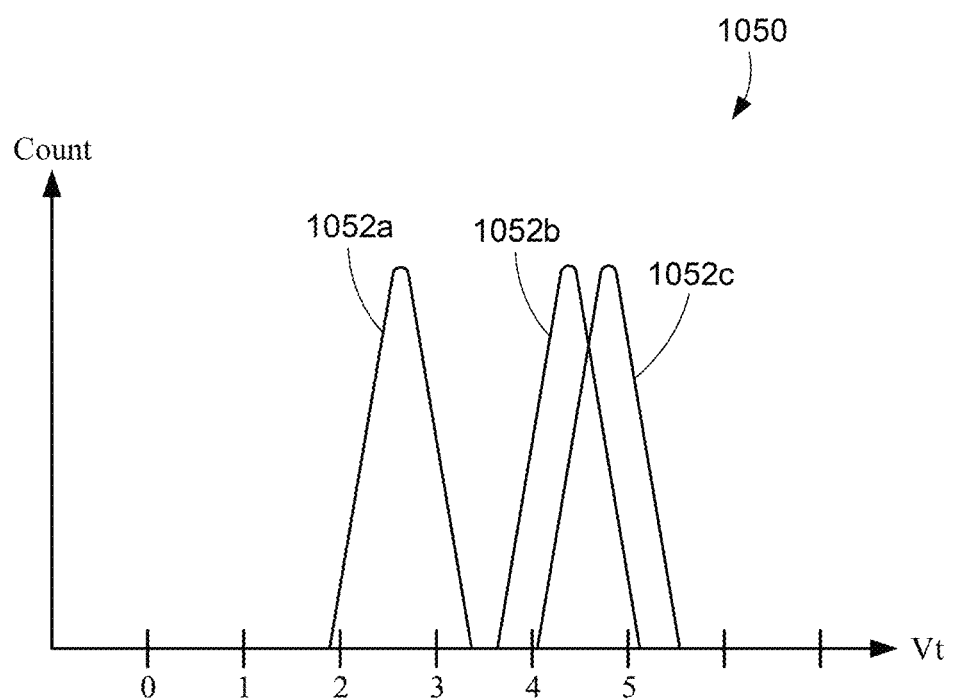
FIG. 10 illustrates a graph showing Vt distributions for SGDT's of different memory holes, in accordance with some described embodiments.

FIG. 10 illustrates a graph 1050 showing Vt distributions for SGDT's of different memory holes, in accordance with some described embodiments. It should be noted that in some embodiments, a memory system may not include SGDT's. In these embodiments, the SGD is used as a select gate for erase operations, and the modifications described for SGDT's can apply to SGD. The curves 1052*a*, 1052*b*, and 1052*c* (or plots) represent a distribution of programmed Vt's for memory holes. The curve 1052*a* shows a Vt distribution for a row of memory holes that includes FC-SGD. The curve 1052*b* shows a Vt distribution for a row of memory holes that includes SC-SGD memory holes with a first amount cut away from each memory hole through a SHE cutting operation. The curve 1052*c* shows a Vt distribution for a row of memory holes that includes SC-SGD memory holes with a second amount cut away from each memory hole through a SHE cutting operation. The second amount is different from the first amount. Moreover, the second amount is greater than the first amount. Due to the SHE cutting operations, SC-SGD include slower erase speed as compared to FC-SGD. Further, the amount of cutting to (or material removed from) SC-SGD is inversely proportional to erase speed. Accordingly, SC-SGD with relatively more material removed will have a slower erase speed.

As shown, the FC-SGD are programmed to the lowest Vt. As an example, the center point (highest probability) of the curve 1052*a* is approximately 2.7 volts ("V"). Also, the curves 1052*b* and 1052*c* (representing SC-SGD) indicate the SC-SGD's are each programmed to a higher Vt as compared to FC-SGD. Moreover, the curve 1052*c*, representing SC-SGD having a relatively higher amount of material cut, indicates the SC-SGD is programmed to a higher Vt as compared to SC-SGD with a relatively lower amount of material cut. As an example, the center point (highest probability) of the curve 1052*b* is approximately 4.4 V, and the center point (highest probability) of the curve 1052*b* is approximately 4.8 V. SC-SGD technology is known to slow erase speed, and accordingly, cause the erase speeds to be less than that of FC-SGD. However, the selected programming voltages for SC-SGD, being higher than that of FC-SGD, will cause the erase speeds of the SC-SGD memory holes to increase and match that of the FC-SGD, or at least within a threshold erase speed.

The disclosed voltages are exemplary and may differ in other embodiments. Generally, however, the FC-SGD is programmed to the lowest Vt, while SC-SGD's are programmed to a higher Vt, and further, the Vt is proportional to the degree of cutting of SC-SGD. While the embodiment described in FIG. 10 shows higher programming for SC-SGD, adjustments to FC-SGD can be programmed to even lower Vt's to match erase speeds of SC-SGD. Still further, in some embodiments, some combination of increased Vt programming for SC-SGD and decreased Vt programming for FC-SGD can be used to match erase speeds among FC-SGD and SC-SGD's, including SC-SGD's with different cutting levels.

Figure 11:
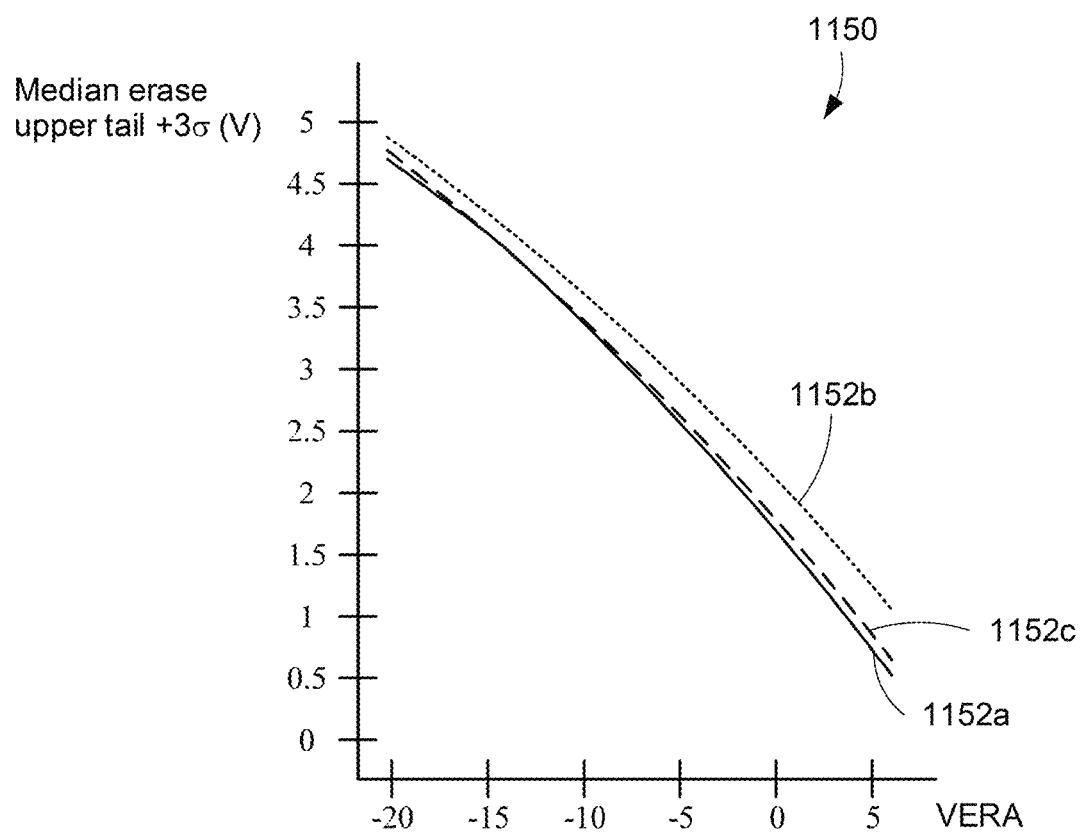
FIG. 11 illustrates a graph showing erase speed matching between SC-SGD and FC-SGD.

FIG. 11 illustrates a graph 1150 showing erase speed matching between SC-SGD and FC-SGD. The graph 1150 shows a median erase upper tail +3σ (units in V) vs erase voltage, Verase ("VERA"). In the graph 1150, a curve 1152*a* representing FC-SGD is programmed approximate to 2.75 V. Also, a curve 1152*b* (dotted line) representing SGDT, which is emulated by SC-SGD, is programmed approximately to 2.75 V. Last, a curve 1152*c* (dotted line) representing SGDT, which is emulated by SC-SGD, is programmed approximately to 4.40 V. These voltages are exemplary, and other voltages are possible. The graph 1150 illustrates FC-SGD has a higher erase speed than SC-SGD, when both are programmed to the same voltage. However, by increasing the voltage on SC-SGD, the electric field between the drain and the channel increases, thereby increasing the hole injection. The shift on SC-SGD from the curve 1152*b*, at 2.75 V, to the curve 1152*c*, at 4.40 V, shows the increased Vt causes the erase speed to increase, as the increasing negative slope corresponds to faster erase speed. Accordingly, the hole injection operation is increased for increased Vt, and SC-SGD erase speed can increase to match that of FC-SGD.

Figure 12A:
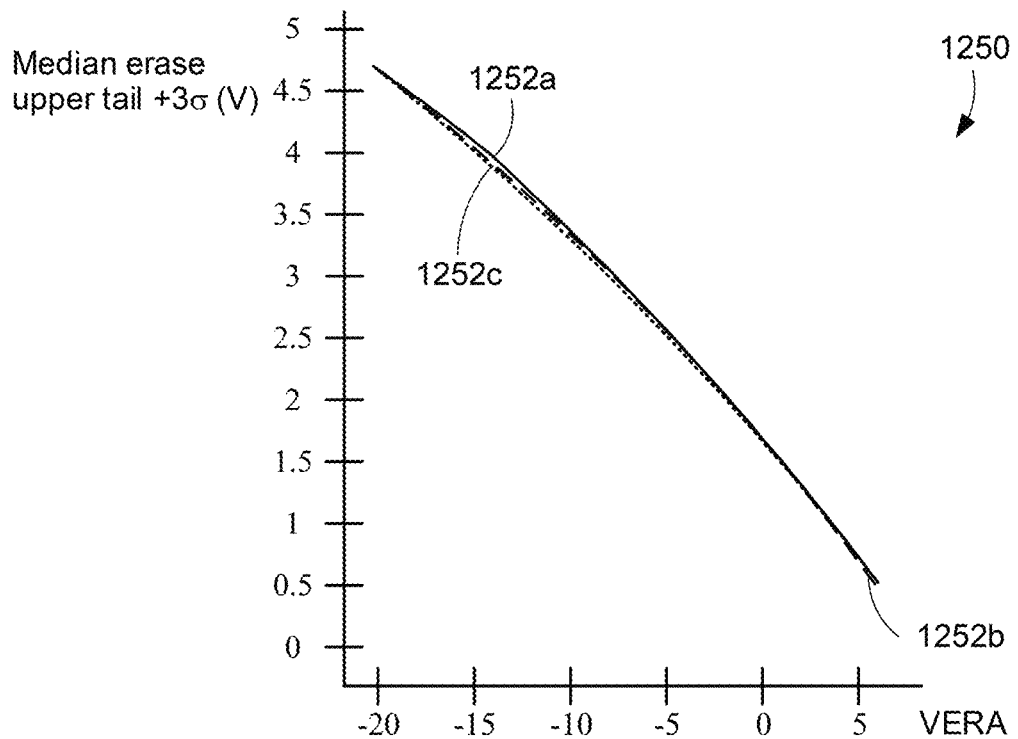
FIGS. 12A and 12B illustrate graphs and showing erase speeds decreasing from FC-SGD to SC-SGD.
Figure 12B:
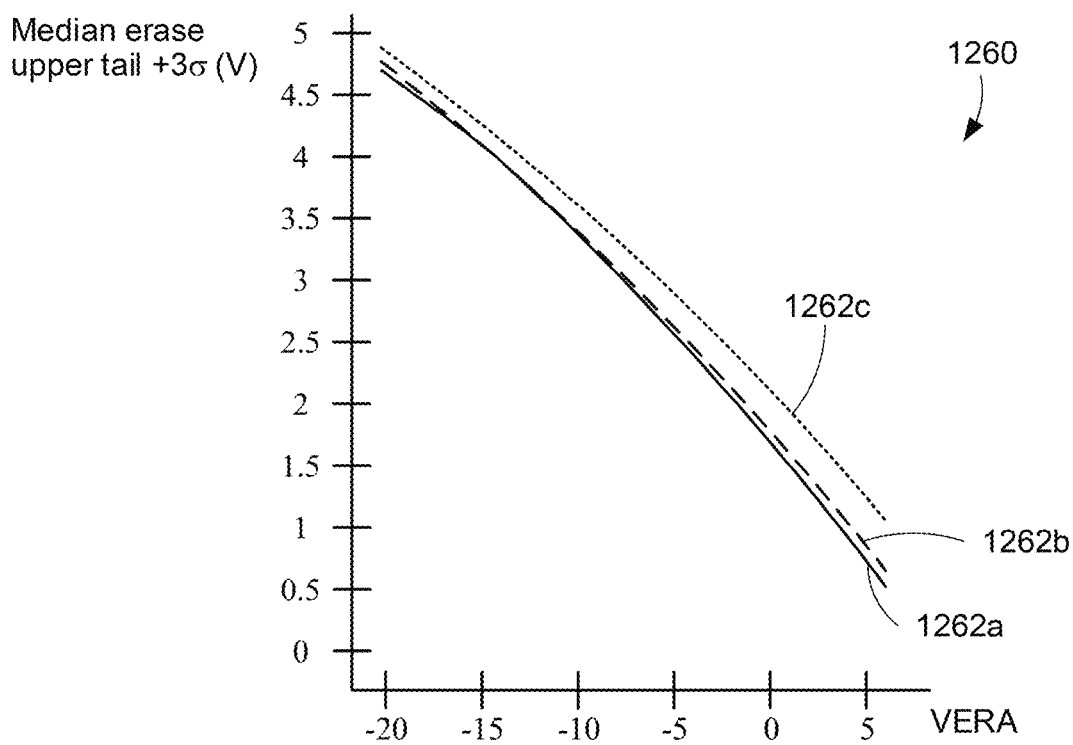

FIGS. 12A and 12B illustrate graphs 1250 and 1260 showing erase speeds decreasing from FC-SGD to SC-SGD. The graphs 1250 and 1260 show a median erase upper tail +3δ (units in V) vs erase voltage, Verase ("VERA"). In the graph 1250 in FIG. 12A, curves 1252*a*, 1252*b*, and 1252*c*, represent three rows of FC-SGD memory holes. When programmed to the same Vt, the curves 1252*a*, 1252*b*, and 1252*c* illustrates the three rows will have the same, or approximately the same, erase speed.

The graph 1260 in FIG. 12B shows curves 1262*a*, 1262*b*, and 1252*c*, represent three rows of SC-SGD memory holes. Moreover, the degree, or amount, to which the three SC-SGD's are cut all differ. When programmed to the same Vt, the curves 1262*a*, 1262*b*, and 1262*c* illustrates the three rows will each have a different erase speed. The curve 1262*a* represents a row with the least degree/amount of cut, while the curve 1262*c* represents a row with the greatest degree/amount of cut. The curve 1262*b* represents a row with the degree/amount of cut in between the row represented by the curve 1262*a* and the row represented by the curve 1262*c*. The decrease in erase upper tail Vt at a given VERA and increasing negative slope correspond to faster erase speed, and accordingly, the curve 1262*a* represents a row of SC-SGD with the fastest erase speed (and least amount/degree of cut), the curve 1262*c* represents a row of SC-SGD with the slowest erase speed (and most amount/degree of cut), and the curve 1262*b* represents a row of SC-SGD with in the middle in terms erase speed and amount/degree of cut.

The curves 1262*a*, 1262*b*, and 1262*c* in FIG. 12B represent three rows programmed approximately to the same Vt. Referring to FIGS. 12A and 12B, the curves 1262*a*, 1262*b*, and 1262*c* in FIG. 12B can undergo independent programming to different Vt's such that their respective erase speeds can match, or approximately match to within a predetermined threshold. Using independent Vt's, the curves 1262*a*, 1262*b*, and 1262*c* in FIG. 12B can be altered to match the curves 1252*a*, 1252*b*, and 1252*c*, respectively, in FIG. 12A. Thus, multiple rows of a memory block can be independent programmed to different Vt's to produce matching erase speeds.

There are several ways to determine the Vt used to program various rows and strings. For example, once the SHE cutting operation is performed, a determination can be made as to which memory holes are full circle (FC-SGD) and semi-circle (SC-SGD). Then, a subsequent determination can be made as to which strings and bit lines having memory holes with SC-SGD in the string. This can be performed by, for example, a prepared look-up table or fixed input-output (I/O). Once the bit lines or strings with SC-SGD memory holes are identified, the programming voltage can be applied. For example, a pulse-by-pulse programming operation can be applied to the SGDT's on both FC-SGDs and SC-SGDs together, where each programming pulse is followed by a verification process that includes verifying whether the SGDT Vt level of each memory hole ("NM") has crossed its predetermined verify level. Predetermined verify level for FC-SGDs is less than that for SC-SGDs. The pulse-by-pulse programming operation can continue until the current Vt level is at least at the predetermined verify level. The predetermined verify level may also be contained in a look-up table, or alternatively, provided through a wired or wireless communication channel. As noted previously, the Vt for FC-SGD is less than Vt for SC-SGD. The respective Vt's and hence the predetermined verify levels are selected to match erase speeds for FC-SGD and SC-SGD. Moreover, an additional determination can be made as to the amount/degree the memory holes SC-SGD are cut. For example, when a determination is made that one string of memory holes with SC-SDG is cut to a greater degree than another string, the string cut to a greater degree can be programmed (and verified) to a higher Vt as compared to the other string. The respective Vt's are selected to match erase speeds for string with SC-SGD and well as match the erase speed for FC-SGD. Also, in some embodiments, the Vt for FC-SGD and SC-SGD (including multiple different cuts to SC-SGD) are adjusted to create strings (and ultimately blocks) with similar erase speeds. Alternatively, FC-SGDs and SC-SGDs can be programmed separately, one after the other, to different Vt's using different verify levels.

Further, in some embodiments, once the SHE cutting operation is performed, a determination can be made as to which memory holes are full circle (FC-SGD) and semi-circle (SC-SGD). The determination can be made by performing an erase pulse and counting the fast and slow bits, or counting the erase speeds for the strings in a block, and storing this information. Then, the information can be retrieved and used to determine the programming voltage. For example, the SGDT on FC-SGD can be programmed to a relatively low Vt, while the SGDT on SC-SGD can be programmed to different Vt's based upon their determined erase speed, with the determined erase speed being retrieved from the stored information.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for programming a memory device, the method comprising:
    programming one or more select gates of a first row of memory holes to a first threshold voltage, wherein the one or more select gates of the first row of memory holes defines define full circle drain side select gate (FC-SGD);
    causing, based on the first threshold voltage, the one or more select gates of the first row of memory holes to include a first erase speed;
    programming one or more select gates of a second row of memory holes to a second threshold voltage different from the first threshold voltage, wherein the one or more select gates of the second row of memory holes defines semi-circle drain side select gate (SC-SGD); and
    causing, based on the second threshold voltage, the one or more select gates of the second row of memory holes to include a second erase speed that is at least within a threshold erase speed of the first erase speed.

2. The method according to claim 1, wherein the second erase speed matches the first erase speed.

3. The method according to claim 1, wherein:
    programming the one or more select gates of the first row of memory holes comprises applying a first programming voltage, and
    programming the one or more select gates of the second row of memory holes comprises applying a second programming voltage that is greater than the first programming voltage.

4. The method according to claim 1, further comprising, prior to programming the one or more select gates of the first row and the one or more select gates of the second row:
    determining whether the one or more select gates of the second row of memory holes defines the SC-SGD; and
    programming the one or more select gates of the second row of memory holes based upon a predetermined verify level.

5. The method according to claim 1, further comprising, prior to programming the one or more select gates of the first row of memory holes and the one or more select gates of the second row memory holes:
    providing an erase pulse to one or more select gates of the first row of memory holes and the one or more select gates of the second row of memory holes; and
    determining, based on the erase pulse, a first erase speed of the one or more select gates of the first row of memory holes and a second erase speed of the one or more select gates of the second row of memory holes.

6. The method according to claim 5, further comprising, when the first erase speed is faster than the second erase speed, setting the second threshold voltage higher than the first threshold voltage.

7. The method according to claim 1, wherein:
    the one or more select gates of the first row of memory holes are located in a first row of a memory block of the memory device, and
    the one or more select gates of the second row of memory holes are located in a second row of the memory block.

8. A memory system, comprising:
    a memory device; and
    a controller operatively coupled to the memory device, the controller configured to:
        program one or more select gates of a first row of memory holes to a first threshold voltage, wherein the first row of memory holes defines define full circle drain side select gate (FC-SGD);
        cause, based on the first threshold voltage, the first row of memory holes to include a first erase speed;
        program one or more select gates of a second row of memory holes to a second threshold voltage different from the first threshold voltage, wherein the second row of memory holes defines semi-circle drain side select gate (SC-SGD); and cause, based on the second threshold voltage, the second row of memory holes to include a second erase speed that is at least within a threshold erase speed of the first erase speed.

9. The memory system according to claim 8, wherein the second erase speed matches the first erase speed.

10. The memory system according to claim 8, wherein the controller is further configured to:

program the one or more select gates of the first row of memory holes comprises applying a first programming voltage, and program the one or more select gates of the second row of memory holes comprises applying a second programming voltage that is greater than the first programming voltage.

11. The memory system according to claim 8, wherein the controller is further configured to, prior to programming the first row and the second row:

determine whether the one or more select gates of the second row of memory holes defines the SC-SGD; and program the one or more select gates of the second row of memory holes based upon a predetermined verify level.

12. The memory system according to claim 8, wherein the controller is further configured to, prior to programming the first row and the second row:

provide an erase pulse to one or more select gates of the first row of memory holes and the one or more select gates of the second row of memory holes; and determine, based on the erase pulse, a first erase speed of the one or more select gates of the first row of memory holes and a second erase speed of the one or more select gates of the second row of memory holes.

13. The memory system according to claim 12, wherein the controller is further configured to, when the first erase speed is faster than the second erase speed, set the second threshold voltage higher than the first threshold voltage.

14. The memory system according to claim 8, wherein:

the one or more select gates of the first row of memory holes are located in a first row of a memory block of the memory device, and the one or more select gates of the second row of memory holes are located in a second row of the memory block.

15. A non-transitory computer readable storage medium configured to store instructions that, when executed by a processor included a controller of a memory system, cause the memory system to carry out steps to:

program one or more select gates of a first row of memory holes to a first threshold voltage, wherein the first row of memory holes defines define full circle drain side select gate (FC-SGD);

cause, based on the first threshold voltage, the first row of memory holes to include a first erase speed;

program one or more select gates of a second row of memory holes to a second threshold voltage different from the first threshold voltage, wherein the second row of memory holes defines semi-circle drain side select gate (SC-SGD); and cause, based on the second threshold voltage, the second row of memory holes to include a second erase speed that is at least within a threshold erase speed of the first erase speed.

16. The non-transitory computer readable storage medium according to claim 15, wherein the second erase speed matches the first erase speed.

17. The non-transitory computer readable storage medium according to claim 15, wherein the instructions further cause the memory system to carry out steps to:

program the one or more select gates of the first row of memory holes comprises applying a first programming voltage, and program the one or more select gates of the second row of memory holes comprises applying a second programming voltage that is greater than the first programming voltage.

18. The non-transitory computer readable storage medium according to claim 15, wherein the instructions further cause the memory system to carry out steps to, prior to programming the first row and the second row:

determine whether the one or more select gates of the second row of memory holes defines the SC-SGD; and program the one or more select gates of the second row of memory holes based upon a predetermined verify level.

19. The non-transitory computer readable storage medium according to claim 18, wherein the instructions further cause the memory system to carry out steps to, prior to programming the first row and the second row:

provide an erase pulse to the one or more select gates of the first row of memory holes and the one or more select gates of the second row of memory holes; and determine, based on the erase pulse, a first erase speed of the one or more select gates of the first row of memory holes and a second erase speed of the one or more select gates of the second row of memory holes.

20. The non-transitory computer readable storage medium according to claim 19, wherein the instructions further cause the memory system to carry out steps to, when the first erase speed is faster than the second erase speed, set the second threshold voltage higher than the first threshold voltage.

* * * * *